United States Patent

[11] 3,579,079

[72] Inventor Fred W. Kelley, Jr.
Media, Pa.
[21] Appl. No. 514,430
[22] Filed Nov. 17, 1965
[45] Patented May 18, 1971
[73] Assignee General Electric Company

[54] CURRENT SOURCE MAGNETIC GATING CIRCUIT FOR CONTROLLED RECTIFIERS
2 Claims, 1 Drawing Fig.

[52] U.S. Cl. .......... 321/5, 321/14, 321/25
[51] Int. Cl. .......... H02m 1/08
[50] Field of Search .......... 321/5, 11—14, 25; 323/22 (SCR); 317/16, 33; 307/88.5 (16), (1.20); 315/194

[56] References Cited
UNITED STATES PATENTS
2,781,420 2/1957 Eno .......... 323/89
3,176,212 3/1965 DePuy .......... 323/22SCR

*Primary Examiner*—William H. Beha, Jr.
*Attorneys*—J. Wesley Haubner and Albert S. Richardson, Jr.

ABSTRACT: For triggering semiconductor controlled rectifiers, an otherwise conventional gate pulse generator is given the characteristics of a current source by connecting in series therewith a nonlinear impedance comprising a diode poled to block gate current and shunted by the series combination of a source of forward bias voltage and a current limiting resistor.

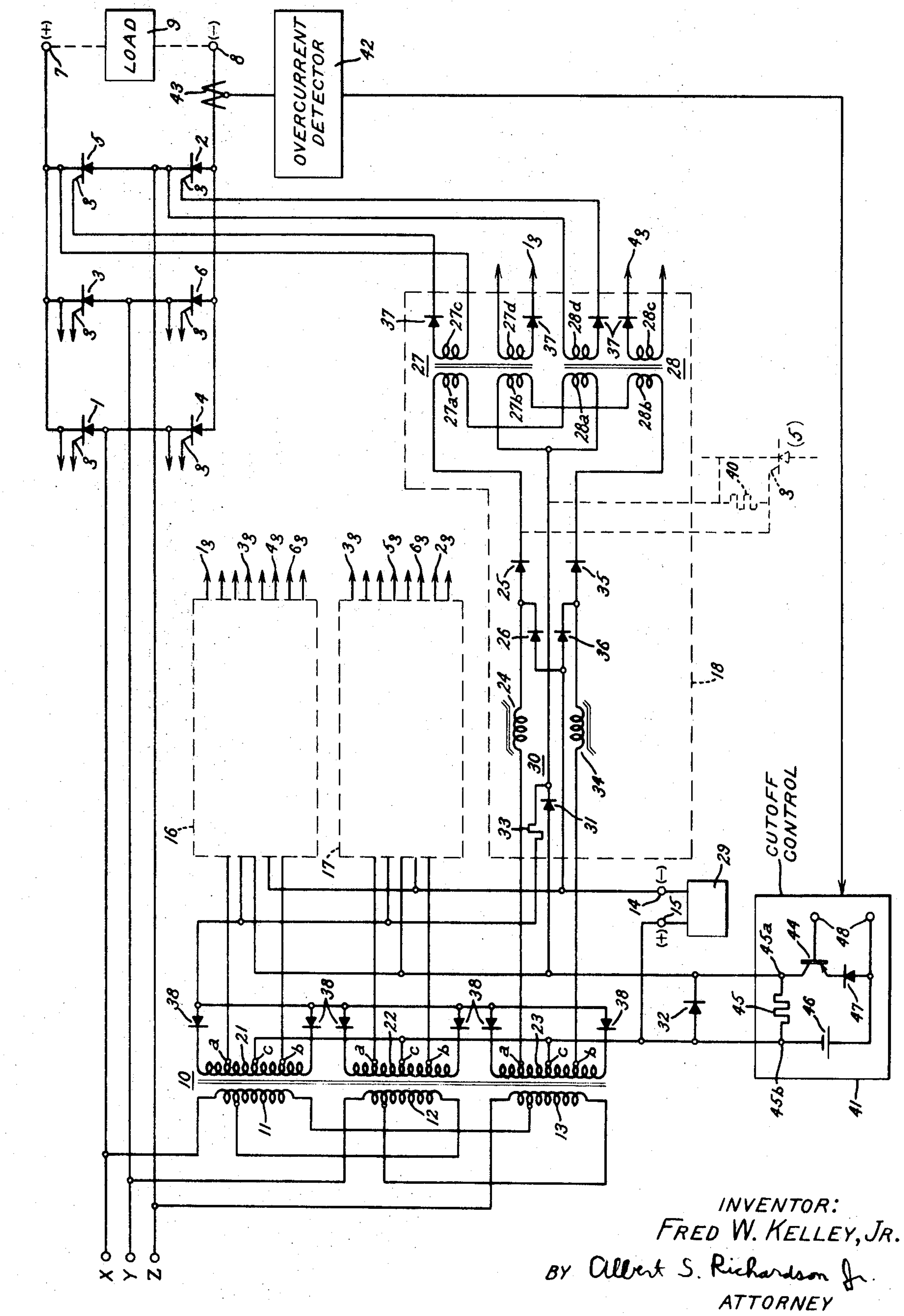
INVENTOR:
FRED W. KELLEY, JR.
BY Albert S. Richardson Jr.
ATTORNEY

CURRENT SOURCE MAGNETIC GATING CIRCUIT FOR CONTROLLED RECTIFIERS

This invention relates to control means for turning on electric valves, and more particularly it relates to a current source magnetic amplifier gating circuit for semiconductor controlled rectifiers.

In the art of static power conversion, it is common practice to use electric valves known generally as thyristors or controlled rectifiers. A controlled rectifier is a unidirectionally conducting device having an anode, a cathode, and a gate electrode. With forward voltage across its anode-to-cathode terminals (i.e., with the anode at a positive potential with respect to the cathode), it can be switched from a high-impedance blocking state to a low-forward-impedance conducting state by applying an electric signal of appropriate polarity, magnitude, and duration between the gate and cathode terminals. The signal that initiates this "triggering" or turn-on action is referred to hereinafter as a gate pulse, and the control means for producing the gate pulse is referred to as a gating circuit.

In many applications it is necessary to exercise control over the time at which a controlled rectifier is triggered with respect to a periodic reference quantity. Toward this end gating circuits employing magnetic amplifiers have been popular. For example, a particularly advantageous design of such a phase shift gating circuit for thyratrons is shown and described in a paper by J. H. Burnett, "A Magnetic Thyratron Grid Control Circuit, "Proceedings of the IRE," Apr. 1956, pages 529—32. Although such gating circuits have heretofore been proposed for solid state controlled rectifiers of the multilayer semiconductor type (silicon controlled rectifiers), they are not altogether satisfactory because a conventional magnetic amplifier gating circuit is in essence a voltage source.

Unlike voltage-responsive thyratrons, a semiconductor controlled rectifier is triggered by supplying its gate with a current pulse of threshold magnitude and width. The value of gate voltage that must be developed to produce the requisite current is known to vary over a relatively wide range among individual devices of the same type. For example, a gate voltage spread of greater than 0.8 to 3.0 volts is not uncommon. Furthermore, the gate impedance of a semiconductor rectifier is nonlinear and gate current can rapidly multiply in the device if the instantaneous value of the applied gate voltage increases beyond the trigger point. See Sections 5.2 to 5.2.4, pages 192—99 of SEMICONDUCTOR CONTROLLED RECTIFIERS by F. E. Gentry et al. (Prentice-Hall, Englewood Cliffs, N.J., 1964).

Because of these characteristics of a semiconductor controlled rectifier, a voltage source gating circuit is unsatisfactory. If such a circuit were designed to supply normal gate current to a controlled rectifier at the maximum gate voltage for triggering, it will produce excessive current in another device requiring less gate voltage. And the same problem exists when applying a voltage source gating circuit driven by a sinusoidal supply voltage to any given semiconductor device. Such excessive current is undesirable because of the danger of overheating the controlled rectifier and because of the resulting power losses in the gating circuit. The use of a current limiting resistor in series with the gate tends to reduce the danger of overdriving the device, but it undesirably increases the volt-ampere requirements of the gating circuit.

Accordingly, a general object of the present invention is to provide an improved magnetic amplifier gating circuit of minimum power rating for supplying limited-current gate pulses to a controlled rectifier.

Another object of the invention is to provide a magnetic gating circuit characterized by improved efficiency and economy.

In carrying out the invention in one form, a gating circuit for supplying gate pulses to a controlled rectifier comprises, in series, a pair of alternating voltage supply terminals, a magnetic amplifier, and load circuit means (including a diode and current limiting means) adapted to be connected to the gate electrode of the controlled rectifier. The current limiting means preferably comprises a second diode connected in series with the diode of the load circuit means and poled in opposition thereto, with the second diode being shunted by the series combination of a source of relatively high forward bias voltage and a linear bias resistor. Consequently the current limiting means presents negligible impedance to load current until that current attains a predetermined magnitude equal to the quotient of the bias voltage and the bias resistance, whereupon it exhibits a substantial impedance that effectively blocks further current rise. The bias resistance is selected so that the predetermined limited magnitude of load current is the minimum amount required for triggering the controlled rectifier. With this arrangement the gating circuit performs as though it were a current source. Upon operation of the magnetic amplifier only the limited magnitude of current is drawn from the supply terminals, the volt-ampere rating of the magnetic amplifier can therefore be minimized, and virtually none of its input power will be wasted or dissipated in a current limiting resistor.

My invention will be better understood and its various objects and advantages will be more fully appreciated from the following description taken in conjunction with the accompanying drawing, the single FIGURE of which is a schematic circuit diagram of a bridge rectifier and its gating circuits embodying my invention.

With reference now to the drawing, six semiconductor controlled rectifiers 1, 2, 3, 4, 5, and 6 are shown in a 3-phase full-wave bridge configuration (sometimes called a 3-phase double-way circuit). Three input terminals X, Y, and Z of this circuit are adapted to be energized by a 3-phase source of sinusoidal alternating voltage of commercial power frequency (e.g., 60 cycles per second) having a phase rotation X-Y-Z. The positive and negative output terminals 7 and 8 of the bridge rectifiers are adapted to be connected to a DC load circuit that is illustrated symbolically at 9. The controlled rectifiers 1—6 have been connected between these input and output terminals as shown, and they are triggered in numerical sequence by a train of gate pulses supplied to their respective gates *g* in synchronism with the alternating input voltage.

Maximum DC output voltage is obtained when each of the odd rectifiers 1, 3, and 5 is triggered at the instant its anode voltage becomes more positive than that of the other odd rectifiers, and when each of the even rectifiers 2, 4, and 6 is triggered at the instant its cathode voltage becomes more negative than that of the other even rectifiers. This is the zero "trigger delay angle" operating condition. The average DC voltage would be reduced to zero if the trigger delay angle were increased to somewhere in the range of 90 to 120 electrical degrees, depending on the relative amount of load reactance. Thus by varying the trigger delay angle the magnitude of voltage that is applied to the load 9 can be varied. This mode of voltage control is commonly known as phase retard, and in a manner soon to be described the amount of phase retard is determined by a DC control element connected to the illustrated gating circuits.

The gating circuits are seen to comprise a polyphase alternating supply voltage transformer 10, a pair of DC control terminals 14 and 15, and three identical gate pulse generators 16, 17, and 18. The transformer 10 comprises three primary windings 11, 12, and 13 that are inductively coupled to three center-tapped secondary windings 21, 22, and 23, respectively. The transformer primary windings are connected across the input terminals X, Y, and Z of the bridge rectifier in an extended-delta configuration, whereby the alternating supply voltage between opposite terminals *a* and *b* of the secondary winding 21 leads the voltage between terminals X and Z by approximately 15 electrical degrees, the supply voltage between terminals *a* and *b* of the secondary winding 22 leads the voltage between terminals Y and X by the same angle, and the supply voltage between terminals *a* and *b* of winding 23 similarly leads the voltage between terminals Z and Y. (This 15° phase shift ensures that gate power is available for the controlled rectifiers 1—6 when operating at zero phase retard.) The alternating voltages taken from the opposite terminals *a* and *b* and the center tap *c* of each of the secondary windings 21, 22, and 23 are supplied to the gate pulse generators 16, 17, and 18, respectively.

Each of the gate pulse generators 16, 17, and 18 comprises a pair of amplifier circuits having certain components in common. Only the generator 18 has been shown in detail in the drawing, it being understood that the other two are internally identical.

The first amplifier circuit of the illustrated generator 18 is seen to include a saturable reactor 24 preferably having only a single winding. The saturable reactor 24 is connected to the terminals *a* and *c* of the associated supply voltage transformer winding 23 by means of a load current circuit that comprises, in series, a diode 25, input windings 27*a* and 28*a* of a pair of output transformers 27 and 28, and, in accordance with the present invention, current limiting means 30. The diode 25 is poled to pass forward current only during those alternate half cycles of the supply voltage when terminal *a* is positive with respect to the center tap *c* and to block current throughout each intermediate half cycle when terminal *a* is relatively negative. For resetting purposes, the saturable reactor 24 is additionally connected to the supply voltage terminals *a* and *c* by means of a diode 26 in series with the DC control terminals 14 and 15. The diode 26 is poled to pass reverse current through the reactor 24 during the intermediate half cycles of supply voltage when the terminal *a* is negative with respect to the center tap *c*.

A control element 29 is connected between the terminals 14 and 15. Preferably this element comprises a suitable source of variable control voltage that is applied directly to the terminals 14 and 15 with the polarity shown. Alternatively the element 29 might comprise a variable impedance the magnitude of which can be varied as a function of an external control signal. In any event a resetting voltage equal to the amount by which the supply voltage across the terminals *a* and *c* exceeds the voltage across the terminals 14 and 15 and the forward drop of the diode 26 is impressed on the reactor 24 only while the supply voltage terminal *a* is relatively negative. The operation of this much of the illustrated gate pulse generator is therefore similar to that of a self-saturating magnetic amplifier of the prior art voltage reset type, with the cyclic operating point of the reactor 24 (i.e., the instant when the reactor is abruptly driven to forward saturation, in which state it no longer impedes load current) being delayed after the start of each positive half cycle of the supply terminal *a* for an interval of time that depends on how much the reactor was previously reset, which in turn is determined by the magnitude of voltage across the control signal terminals 14, 15. The delay interval decreases as this magnitude increases. The resulting gate pulses have a trigger delay angle that is 15 electrical degrees less than this interval.

The companion magnetic amplifier circuit of the gate pulse generator 18 comprises, in series between terminals *b* and *c* of the associated secondary winding 23, another single winding saturable reactor 34, a diode 35, second input windings 28*b* and 27*b* of the respective output transformers 28 and 27, and the same current limiting means 30. The diode 35 is poled to pass load current only during those intermediate half cycles of the supply voltage when the terminal *b* is positive with respect to the center tap *c* and to block current throughout the alternate half cycles when terminal *b* is relatively negative. For resetting purposes, the saturable reactor 34 is additionally connected to the supply voltage terminals *b* and *c* by means of a diode 36 in series with the common DC control terminals 14 and 15, diode 36 being poled to pass reverse current through the reactor 34 during the alternative half cycles of supply voltage when terminal *b* is relatively negative. Thus the reactor 34 in circuitry and operation is the mirror image of the reactor 24, saturating in its forward sense during each positive half cycle of the supply terminal *b* and being reset during each negative half cycle of this terminal. The operating delay interval of the reactor 34 will be the same as that of the reactor 24.

The output transformers 27 and 28 are respectively provided with double output windings 27*c*, 27*d* and 28*c*, 28*d*. The output winding 27*c* is connected via a diode 37 to the gate-cathode circuit of the controlled rectifier 5 in order to supply this device with a turn-on gate pulse each time the primary winding 27*a* is energized on operation of the saturable reactor 24, and the output winding 28*c* is connected via another diode 37 to the gate-cathode circuit of the controlled rectifier 4 to supply it with a stay-on gate pulse when primary winding 28*a* is simultaneously energized. Similarly, the output winding 28*d* is connected via a diode 37 to the gate-cathode circuit of the controlled rectifier 2 in order to supply this device with a turn-on gate pulse each time the primary winding 28*b* is energized on operation of the saturable reactor 34, and the output winding 27*d* is connected via still another diode 37 to the gate-cathode circuit of the controlled rectifier 1 to supply it with a stay-on gate pulse when primary winding 27*b* is simultaneously energized.

Corresponding connections from the duplicate gate pulse generators 16 and 17 to the controlled rectifiers 1—6 are indicated by the labeled arrowheads in the drawing.

As previously pointed out, I have also included a current limiting means 30 in the load circuits of the companion magnetic amplifiers 24 and 34. In the illustrated embodiment of my invention this current limiting means comprises a pair of diodes 31 and 32 connected in series with each other between the output transformers 27, 28 and the center tap *c* of the supply voltage transformer winding 23, with both diodes being poled in opposition to the respective load current conducting diodes 25 and 35. Thus the anode of the diode 32 is connected to the terminal *c*, and the anode of the diode 31 is connected to the cathode of diode 32. (Preferably the diode 32 is common to the current limiting means 30 of all three gate pulse generators 16—18, whereas a separate diode 31 is individually associated with each generator.) The diodes 31 and 32 are normally maintained in a conducting state by means of a forward bias voltage that is applied thereto. The forward bias is provided by a direct voltage source in series with a linear bias resistor 33 across the diodes 31 and 32. While any suitable source of bias voltage can be used, I prefer to derive this voltage from the supply voltage transformer 10 by utilizing the whole secondary windings 21, 22, and 23 together with six interconnected diodes 38 to form a full-wave, center tap, polyphase rectifier as is shown in the drawing. Thus the center taps *c* of all three windings 21—23 have been connected in common to the anode of the diode 32, while the end terminals of these windings are respectively connected to the cathodes of the various diodes 38 whose anodes are connected in common, via the bias resistor 33, to the cathode of the diode 31. The rectified voltage impressed across the series combination of the resistor 33 and the diodes 31, 32 causes current normally to circulate in these elements, and so long as both of the diodes 31 and 32 remain forward biased, the magnitude of current traversing the resistor 33 will be approximately equal to the quotient of the average forward bias voltage and the resistance of this resistor. Preferably a single source of forward bias voltage is shared by the current limiting means 30 of all three gate pulse generators 16—18.

The magnitude of the forward bias voltage is selected to be higher than the supply voltage taken across terminals *a* and *c* (or *b* and *c*) by a factor of about three-to-one or greater. As a typical example, the supply voltage might have a peak magnitude of about 30 volts while the forward bias voltage is approximately 150 volts. The resistance of the bias resistor 33 is selected so that the resulting current through it is equal to whatever minimum magnitude of load current is required in the associated gating circuits for triggering the controlled rectifiers that are coupled thereto. For example, 33 could have a resistance of 500 ohms, whereby the predetermined limited magnitude of current would be about 0.3 ampere. This resistance will be substantially higher than the maximum gate-to-cathode resistance of a semiconductor controlled rectifier for all operating conditions encountered.

From the foregoing detailed description of the essential components and circuitry of the preferred embodiment of my invention, its mode of operation can now be readily followed. For purposes of this explanation, the gate circuit of the controlled rectifier 5 can be considered connected across a stabilizing resistor 40 that is conductively included in the gate pulse producing load circuit of the amplifier 24, as is indicated by broken lines in the drawing.

It will be apparent that so long as the diodes 31 and 32 of the current limiting means 30 are conducting current, there is only a small forward voltage drop across them and the instantaneous magnitude of load current in the diode 25 is exclusively determined by the supply voltage at terminals *a* and *c* and the impedance of the magnetic amplifier 24 plus the impedance of the controlled rectifier gate. The impedance of the magnetic amplifier 24 will be very high until, at some controllable point in each positive half cycle of the supply voltage terminal *a* (which point is controlled, as was hereinbefore explained, by the control element 29), the amplifier operates, whereupon its forward impedance becomes negligible and load current can abruptly increase. Commencing at this point and continuing for the remainder of the positive supply voltage half cycle, a gate pulse is supplied via the diode 25 to the controlled rectifier 5. At virtually the same time load current attains the predetermined limited magnitude at which my current limiting means 30 becomes effective.

Whenever the magnitude of load current in the diode 25 equals the aforesaid predetermined magnitude of current in the bias resistor 33, there can be no current in the diode 31. At this point the diode 31 therefore assumes a blocking or reverse bias state. As a result, the net voltage applied to the load circuit will now be the sum of the supply voltage between terminals *a* and *c* and the relatively high forward bias voltage between terminal *c* and resistor 33, and the impedance in this circuit will principally comprise the resistance of the rectifier gate 5*g* plus the predominant resistance of resistor 33. The resistor 33 effectively limits any further increase in load current, even though the magnetic amplifier 24 may have operated in advance of peak supply voltage.

The above-described current limiting means 30 is in effect a nonlinear current limiting impedance that exhibits negligible impedance to low current but responds to current attaining a predetermined limited magnitude by preventing any appreciable rise in the current above that magnitude. Consequently, the gate pulse generator is an economical current source designed to supply only the amount of current required to trigger any controlled rectifier that may be connected thereto. The volt-ampere rating of the magnetic amplifier 24 can be minimized, thereby reducing its size and cost or reducing the input power requirements of the control element 29, and the danger of excessive gate current in the controlled rectifier is avoided. The same advantages can be realized with amplifiers other than the particular one used in the preferred embodiment of my invention. Another specific example of a current source gating circuit using my invention is illustrated in U.S. Pat. application Ser. No. 781,762 filed Dec. 19, 1958, and now issued as U.S. Pat. No. 3,176,212. That patent, which is owned by the assignee of the present application, shows an amplistat circuit embodying my invention for supplying phase-controlled gate signals to a single controlled rectifier in a unique full wave DC power supply.

The diode 32 in the current limiting means 30 may be used to perform an additional function, namely that of suppressing all gate pulses when it is desired to discontinue operating the bridge rectifier 1—6. For example, in some applications it is necessary to deenergize the DC load 9 in high-speed response to the occurrence of an overcurrent condition therein. As is shown in the drawing this protection is afforded by a cutoff control component 41 which is arranged to develop a signal that turns off all three gate pulse generators 16—18 whenever signaled to do so by operation of an overcurrent detector 42 or the like. The overcurrent detector 42 is connected by suitable DC current sensing means 43 to the negative (or alternatively, the positive) conductor of the illustrated bridge rectifier, and it operatively responds when a predetermined abnormal current condition occurs in the load power circuit.

In the preferred embodiment of the invention, the cutoff control component 41 comprises a normally inactive (off) PNP transistor 44 connected in circuit with a collector resistor 45 and a suitable DC supply voltage source 46. The cathode and the anode of diode 32 are respectively connected to the relatively positive and negative terminals 45*a* and 45*b* of the resistor 45, whereby the diode 32 will be reverse biased by the voltage developed across the resistor 45 whenever the transistor 44 is on. The base-emitter junction of the transistor 44, together with a diode 47 in series with the emitter, is connected between a pair of input terminals 48 that are adapted to receive a forward-bias signal from the overcurrent detector 42 on operation thereof. When the forward-bias signal is applied to the terminals 48, the transistor 44 is turned on and the reverse bias voltage for diode 32 is then developed across the collector resistor 45. The parameters of the cutoff control component 41 are selected so that the magnitude of this voltage is at least as high as the peak magnitude of the supply voltage for the gate pulse generators.

The magnetic amplifiers 24 and 34 in the gate pulse generators 16—18 cannot operate while the reverse bias voltage is applied to the diode 32. This is because the reverse bias voltage opposes the supply voltage in the load circuit of each amplifier, and there is then no net forward voltage impressed on the amplifier to drive it into saturation. Consequently all gate pulses will be suppressed until the reverse bias voltage is subsequently removed by deenergizing the input terminals 48 of the cutoff control component 41, whereupon the transistor 44 returns to its normally inactive or turned off state.

While I have shown and described a preferred form of my invention by way of illustration, many modifications will undoubtedly occur to those skilled in the art. I therefore contemplate by the claims that conclude this specification to cover all such modifications as fall within the true spirit and scope of the invention.

I claim:

1. A gating circuit for supplying gate pulses to a controlled rectifier, comprising:

a. first and second alternating supply voltage terminals;

b. a magnetic amplifier connected to said terminals, said amplifier having control means for determining its cyclic operating point; and c. load circuit means, including a load current conducting diode, for interconnecting said terminals, said amplifier, and the controlled rectifier, whereby gate pulses are supplied to the controlled rectifier on operation of the magnetic amplifier during those alternate half-cycles of the supply voltage when said first terminal is positive with respect to said second terminal;

d. said load circuit means including nonlinear impedance means responsive to load current attaining a predetermined magnitude for limiting further increase thereof, said nonlinear impedance means comprising;

i. second and third diodes connected in series with each other in said load circuit means, both of said second and third diodes being poled in opposition to said load current conducting diode, ii. a source of forward bias voltage connected across said second and third diodes, iii. a current limiting resistor in series with said source across said second and third diodes, and iv. cutoff means connected across said third diode for applying a reverse bias voltage thereto whenever suppression of gate pulses is desired.

2. A gating circuit for producing gate pulses capable of alternately turning on two interconnected controlled rectifiers, comprising:

a. an alternating supply voltage transformer winding having first and second opposite terminals and a center tap therebetween;

b. a pair of magnetic amplifiers connected respectively to said first and second terminals, said amplifiers having control means for determining their cyclic operating points;

c. current limiting means connected to said center tap, said current limiting means comprising first and second serially interconnected diodes poled in agreement with one another and shunted by the series combination of a source of forward bias voltage and a current limiting resistor;

d. a first gate pulse producing load circuit including in series one of said amplifiers, said current limiting means, and a third diode poled in opposition to said first diode, whereby current of only a limited magnitude can be conducted by said first load circuit during those supply voltage half cycles when said first terminal is positive with respect to said second terminal;

e. a second gate pulse producing load circuit including in series the other amplifier, said current limiting means, and a fourth diode poled in opposition to said first diode, whereby current of only said limited magnitude can be conducted by said second load circuit during those supply voltage half cycles when said first terminal is negative with respect to said second terminal;

f. cutoff means connected across said second diode for applying a reverse bias voltage thereto when activated; and g. means connected to said cutoff means and responsive to current conducted by the controlled rectifiers for activating said cutoff means when a predetermined abnormal current condition occurs.